12) United States Patent
Walls et al.

(10) Patent No.: US 6,270,945 B1
(45) Date of Patent: Aug. 7, 2001

(54) PHOTOSENSITIVE COMPOSITIONS AND ELEMENTS COMPRISING DYED PHOTOSENSITIVE POLYESTERS

(75) Inventors: John E. Walls, Fort Collins; Thomas R. Jordan, Windsor, both of CO (US)

(73) Assignee: Kodak Polychrome Graphics, LLC, Norwalk, CT (US)

( * ) Notice: Subject to any disclaimer, the term of this patent is extended or adjusted under 35 U.S.C. 154(b) by 0 days.

(21) Appl. No.: 09/084,708

(22) Filed: May 26, 1998

Related U.S. Application Data

(63) Continuation-in-part of application No. 08/820,935, filed on Mar. 19, 1997, now abandoned.

(51) Int. Cl.$^7$ ...................................................... G03C 1/73
(52) U.S. Cl. ................... 430/285.1; 430/281.1; 430/287.1; 430/278.1; 524/35
(58) Field of Search ...................... 430/285.1, 541, 430/287.1, 281.1, 278.1, 175; 524/35

(56) References Cited

U.S. PATENT DOCUMENTS

| | | | |
|---|---|---|---|
| 2,725,372 * | 11/1955 | Minsk et al. ...................... | 260/91.3 |
| 3,030,208 | 4/1962 | Schellenberg et al. . | |
| 3,615,434 | 10/1971 | McConkey et al. ................ | 96/28 |
| 3,622,320 * | 11/1971 | Allen ................................. | 96/28 |
| 3,674,745 | 7/1972 | Philpot et al. ..................... | 260/75 VA |
| 3,699,135 | 10/1972 | Baptista ............................. | 528/28 |
| 3,702,765 | 11/1972 | Laakso . | |
| 3,918,976 * | 11/1975 | Arai et al. ......................... | 96/84 |
| 3,929,489 | 12/1975 | Arcesi et al. . | |
| 4,001,169 * | 1/1977 | Cheetham et al. ................. | 260/40 |
| 4,258,124 * | 3/1981 | Shimizu et al. ................... | 430/285 |
| 4,267,306 | 5/1981 | Davis et al. . | |
| 4,271,261 * | 6/1981 | Shimizu et al. ................... | 430/325 |
| 4,343,888 * | 8/1982 | Burg ................................... | 430/302 |
| 4,359,570 | 11/1982 | Davis et al. . | |
| 4,381,261 | 4/1983 | Bonnet .............................. | 522/97 |
| 4,403,092 * | 9/1983 | Davis et al. ....................... | 528/290 |
| 4,419,437 * | 12/1983 | Noonan et al. .................... | 430/270.1 |
| 4,477,552 * | 10/1984 | Day et al. .......................... | 430/175 |
| 4,535,051 | 8/1985 | Simon et al. ...................... | 430/241 |
| 4,999,418 | 3/1991 | Krutak et al. . | |
| 5,032,670 | 7/1991 | Parham et al. .................... | 528/220 |
| 5,372,864 * | 12/1994 | Weaver et al. .................... | 428/36.92 |

* cited by examiner

*Primary Examiner*—Hoa Van Le
*Assistant Examiner*—Yvette M. Clarke
(74) *Attorney, Agent, or Firm*—Ratner & Prestia

(57) ABSTRACT

Photosensitive polyesters having dye moieties incorporated into the polyester backbone are disclosed. The photosensitive polyesters contain an unsaturated photosensitive moiety comprising photopolymerizable —CH═CH—CO— groups and dye moieties derived from dyes that are copolymerizable diols. Negative-working photosensitive elements, such as negative-working printing plates, can be prepared using these photosensitive polyesters.

21 Claims, No Drawings

PHOTOSENSITIVE COMPOSITIONS AND ELEMENTS COMPRISING DYED PHOTOSENSITIVE POLYESTERS

CROSS-REFERENCE TO RELATED APPLICATIONS

This application is a continuation-in-part of application Ser. No. 08/820,935, filed Mar. 19, 1997, abandoned incorporated herein by reference.

FIELD OF THE INVENTION

This invention relates to lithographic printing. In particular, it relates to negative-working photosensitive compositions and their use in lithographic printing plates.

BACKGROUND OF THE INVENTION

Lithographic printing is based upon the immiscibility of oil and water, in which the oily material or ink is preferentially retained by the image area and the water or fountain solution is preferentially retained by the non-image area. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum support. The coating may respond to light by having the portion that is exposed become soluble so that it is removed in the developing process. Such a plate is referred to as a positive-working printing plate. When the exposed portion of the printing plate becomes insoluble, the plate is referred to as a negative-working plate. In each instance, the image areas remaining are ink-receptive or oleophilic and the non-image areas or background are water-receptive or hydrophilic. The differentiation between image and non-image areas is made in the exposure process where a film is applied to the plate under a vacuum to insure good contact. The plate is then exposed to a light source, a portion of which is composed of ultraviolet radiation. In a negative-working plate, the areas on the film corresponding to the image areas are clear, allowing light to harden the image area coating, while the areas on the film corresponding to non-image areas are opaque, so the areas not struck by light can be removed during development. The light-hardened surface of a negative-working plate is oleophilic and will accept ink. The non-image areas, which have had the coating removed through the action of a developer, are hydrophilic.

Negative-working lithographic printing plates comprising a radiation-sensitive composition that includes a photocrosslinkable polymer containing the photosensitive group —CH=CH—CO— as an integral part of the polymer backbone are well known. See, for example, U.S. Pat. No. 3,030,208 (Schellenberg et al.), U.S. Pat. No. 3,622,320 (Allen), U.S. Pat. No. 3,702,765 (Laakso) and U.S. Pat. No. 3,929,489 (Arcesi et al.).

Colorants have been used in negative-working photosensitive compositions to provide a visible image for effective inspection of processed plates. Typical colorants are water-insoluble pigments having a broad spectrum of high-density colors. Use of such pigments may present problems because the pigment dispersions are difficult to make and are not always stable in photosensitive compositions. In severe instances, the pigments aggregate and come out of solution, resulting in a phenomenon known in the art as "shocking". This destroys the entire photosensitive coating.

In contrast, some dyes can be used that are soluble in the photosensitive coating and are thus incapable of "shocking", but the dyes must be carefully selected for compatibility with the polymers that are used. However, because the dyes are soluble in the coating solvents, they cannot be suitably filtered to remove impurities, and when the plates are developed, the developer solution becomes dirty along with the processor itself.

Whether a dye or pigment is used in the photosensitive composition, a problem remains. The colorant tends to leach from the printing plate image because the colorant is a separate component within the composition. This problem arises because of the routine changing of developer solutions and the change in developer solution strength with use and time. In the printing industry, it is common practice to interchange products so that one manufacturer's plate can be processed in another manufacturer's developer solution. In some cases, the developer solution is too inactive for developing the plate for another manufacturer. In other cases, the developer solution may be too active for the specific printing plate, attacking the imaged layer and causing leaching of colorant into the developer solution. In some instances, partial removal of the colorant may lead to the incorrect assumption that the developer solution is attacking the imaged layer when it is not doing so.

Background stain is another common problem attributable to the use of a colorant component in the photosensitive. After the printing plate has been processed, it is not uncommon to see discoloration or tinting of the background of non-image areas. This may be caused by an insufficiently active developer solution, aging of the coating, or simply the staining of the substrate by the colorant. In any case, it is undesirable because it suggests that the printing plate may have or exhibit performance problems.

Thus, a need exists for a negative-working photosensitive composition and printing plate that has an appropriate color but which does not exhibit the problems noted above.

SUMMARY OF THE INVENTION

These problems have been overcome with a negative-working photosensitive composition comprising a photosensitive polyester. The photosensitive polyester comprises: an unsaturated photosensitive moiety comprising photopolymerizable —CH=CH—CO— groups, and a dye moiety represented by Formula I or Formula II:

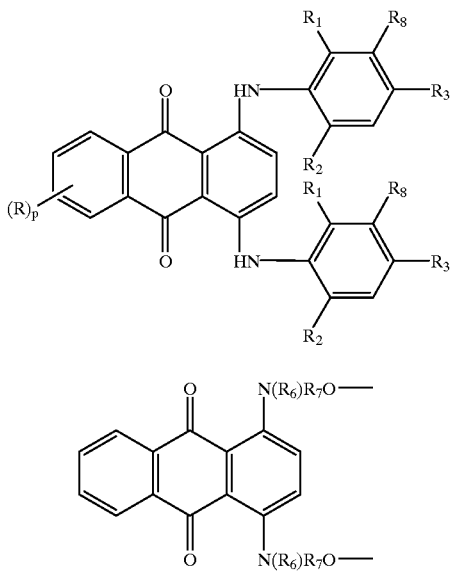

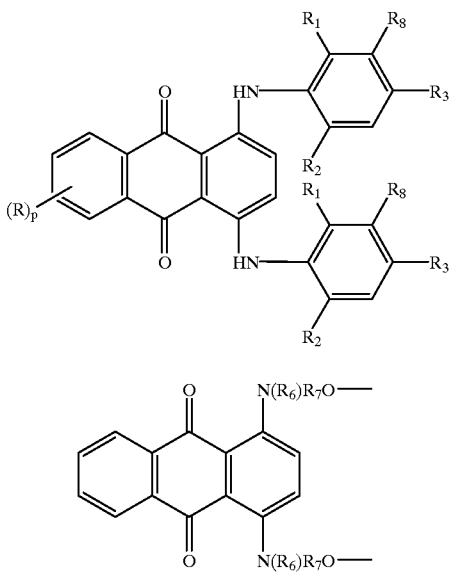

in which R is lower alkyl, halo, hydroxy, carboxy or carbonylalkoxy; $R_1$ and $R_2$ are independently lower alkyl, lower alkoxy or halo; $R_3$ is hydrogen, lower alkyl, lower alkoxy, halo, or —$SO_2N(R_4)R_5O$— in which the sulfur is attached to a carbon of an aromatic ring of the dye moiety; $R_4$ is hydrogen, methyl, ethyl or phenyl; $R_5$ and $R_7$ are independently alkylene having 2 to 7 carbon atoms or phenylene; $R_6$ is hydrogen, methyl, ethyl or phenyl; $R_8$ is hydrogen or —$SO_2N(R_4)R_5O$— in which the sulfur is attached to a carbon of the aromatic ring of the dye moiety, with the proviso that either $R_3$ or $R_8$, but not both $R_3$ and $R_8$, is —$SO_2N(R_4)R_5O$—; and p is 0, 1 or 2.

In another embodiment, this invention is a negative-working photosensitive element comprising a support and a photosensitive layer comprising the photosensitive composition.

The invention provides a dyed photosensitive composition and element that are not susceptible to the problems noted above accompanying the use of dispersed pigments or soluble dyes as colorants. The dyes are incorporated into the backbone of the photosensitive polyester and therefore cannot leach out, cause stain or exhibit "shocking". The amount of incorporated dye can also be varied to advantage by varying the relative amounts of reactants used to prepare the polyester. The dyes are designed to be reactive in the condensation reactions used to prepare the photosensitive polyesters and generally provide a bluish tint to the composition.

DETAILED DESCRIPTION OF THE INVENTION

The dyed photosensitive polyesters are prepared by condensing the appropriate one or more dicarboxylic acids (or functional equivalents such as anhydrides, lower alkyl esters or acid halides) with the appropriate one or more diols (or functional equivalents such as diamines) to form polyester repeating units. The condensation reactive dyes are diols or their functional equivalents.

Copolymerizable Diols

The photosensitive polyesters are prepared using one or more thermally stable condensation reactive dyes that have two hydroxy groups that render them condensable with the photosensitive diacids described below. Functional equivalents, that render the dyes condensable with the photosensitive diacids, such as a carboxy carbonyl halide, an alkyl or aryl ester radical or amino (including alkylamino) may also be used. The ester radical can be an oxycarbonyl, oxycarbonyloxy, oxycarbonylamino or carbonyloxy radical.

Preferred dye moieties, derived from the corresponding copolymerizable diols or their functional equivalents, are represented by Formula I and II.

in which R is substituted or unsubstituted lower alkyl having 1 to 6 carbon atoms (such as methyl, ethyl, n-propyl, i-propyl, t-butyl and hexyl), halo (such as chloro or bromo), hydroxy, carboxy or carbonylalkoxy of 2 to 7 carbon atoms (that is, alkoxy-CO— in which alkoxy has 1 to 6 carbon atoms, as defined above).

$R_1$ and $R_2$ are independently substituted or unsubstituted lower alkyl or substituted or unsubstituted lower alkoxy groups having 1 to 6 carbon atoms (alkyl as defined above) or halo (as defined above).

$R_3$ is hydrogen, substituted or unsubstituted lower alkyl having 1 to 6 carbon atoms (as defined above), substituted or unsubstituted lower alkoxy (as defined above), halo (as defined above), or —$SO_2N(R_4)R_5O$—, in which the sulfur is attached to the aromatic ring of the dye moiety. $R_4$ is hydrogen, methyl, ethyl or phenyl. Each of $R_5$ and $R_7$ is independently of the other, an alkylene having 2 to 7 carbon atoms (such as methylene, ethylene, trimethylene, isopropylene, 2,2-dimethylpropylene, and, 2,2-dimethylpentylene, or phenylene. $R_6$ is hydrogen, methyl, ethyl or phenyl. $R_8$ is hydrogen or $SO_2N(R_4)R_5O$—, in which the sulfur is attached to the aromatic ring of the dye moiety. Only one —$SO_2N(R_4)R_5O$— group is attached to the aromatic ring, so either $R_3$ or $R_8$, but not both, is —$SO_2N(R_4)R_5O$—. Thus, when $R_8$ is —$SO_2N(R_4)R_5O$—, $R_3$ is hydrogen, lower alkyl, lower alkoxy, or halo, and when $R_3$ is —$SO_2N(R_4)R_5O$—, $R_8$ is hydrogen. p is 0, 1, or 2.

Preferably, R is methyl, ethyl, carboxy or methoxycarbonyl; $R_1$ and $R_2$ are independently methyl or ethyl; $R_3$ is hydrogen or ethyl; $R_4$ is hydrogen or ethyl; $R_5$ and $R_7$ are independently ethylene 2,2-dimethylpropylene, or 2,2-dimethylpentylene; $R_6$ is hydrogen or ethyl; $R_7$ is hydrogen or ethyl; and p is 0 or 1.

Representative compounds within the scope of Formula I above are described, for example, in TABLE II of U.S. Pat. No. 4,403,092 (Davis et al.), incorporated herein by reference for the teaching of such compounds that provide a bluish color to the resulting polyester. Compounds of Formula II can be prepared by method well known to those skilled in the art, such as is disclosed in U.S. Pat. No. 5,032,670 (Parham et al.), especially Column 4, lines 7–50, incorporated herein by reference. Preparation of a compound of Formula II in which $R_6$ hydrogen and $R_7$ is —$(CH_2)_2$— is disclosed in Example IV of U.S. Pat. No. 4,535,051 (Simon et al.), incorporated herein by reference. Preparation of a compound of Formula II in which $R_6$ is hydrogen and $R_7$ is —$CH_2$—$C(CH_3)_2$—$CH_2$— is disclosed in Example 3 of U.S. Pat. No. 5,032,670 (Parham et al.), incorporated herein by reference.

In addition to the condensation reactive dye, the photosensitive polyester may comprise other diols. Diols that can be used to make the polyesters include, for example, diols of the formula: HO—$R_{14}$—OH in which $R_{14}$ is a divalent organic radical generally having from 2 to 12 carbon atoms, and optionally including oxygen atoms. Useful divalent radicals include, but are not limited to, straight or branched chain, substituted or unsubstituted hydrocarbon radicals such as alkylene (for example, ethylene, trimethylene, neopentylene and others known in the art), cycloalkylene (such as 1,3-cyclohexylene, 1,4-cyclohexylene and 1,4-cycloheptylene), cycloalkylenebisalkylene (such as 1,4-cyclohexylenedimethylene), arylene (such as phenylene), phenylene-bisalkylene (such as 4-methylenebenzylene), and hydrocarbon-oxy-hydrocarbon radicals having 2 to 12 carbon atoms in each hydrocarbon portion of the radical, such as alkylene-oxy-alkylene, alkylene-oxy-arylene, alkylene-oxy-cycloalkylene, cycloalkylene-oxy-cycloalkylene, such as 1,4-cyclohexane dimethanol, 1,4-bis(β-hydroxyethoxy) cyclohexane, and others that would be readily apparent to one skilled in the art. The corresponding diamines can be substituted for the diols, if desired, or a mixture of diols and diamines can be used

Dicarboxylic Acids

The photocrosslinkable polyester resin (or mixture thereof) typically has one or more photosensitive ethylenically unsaturated groups, such as a —CH=CH—CO— group in either aliphatic or alicyclic moieties. The photosensitive group can be repeated along the backbone (that is incorporated into the resin backbone) or be located pendant to the resin backbone, to provide sites for photocrosslinking for the purpose of insolubilizing the polyester upon actinic irradiation. Preferably, the photosensitive groups are incorporated in the resin backbone. The polyester resin may also have aromatic groups.

Organic radicals that can be pendant to the polyester backbone include, but are not limited to, —$CH_2CH_2OC(O)$ $C(CH_3)=CH_2$, —$CH_2CH(OH)CH_2OC(O)C$ $(CH_3)=CH_2$, —$CH_2CH_2OC(O)CH=CH_2$, and —$CH_2CH(OH)CH_2OC$ $(O)CH=CH_2$.

Representative polyester resins are preferably prepared from one or more compounds represented by the following structures III-VII that have a photosensitive —CH=CH— CO— group that will become part of the polyester backbone:

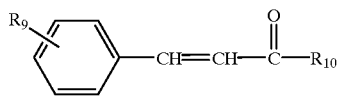

III in which $R_9$ is one or more substituted or unsubstituted alkyl groups having 1 to 6 carbon atoms, substituted or unsubstituted aryl having 6 to 14 carbon atoms, substituted or unsubstituted aralkyl having 7 to 20 carbon atoms, substituted or unsubstituted alkoxy having 1 to 6 carbon atoms, nitro, amino, acrylic, carboxyl, or halo, and is chosen to provide at least one condensation site, such as an acrylate group. $R_{10}$ is hydroxy, substituted or unsubstituted alkoxy having 1 to 6 carbon atoms, halo or oxy if the compound is an acid anhydride. A preferred compound of structure III is p-phenylene diacrylic acid. These and other useful compounds are described in U.S. Pat. Nos. 3,030,208, 3,622,320 and 3,702,765, the disclosures of which are incorporated herein by reference.

Structure IV:

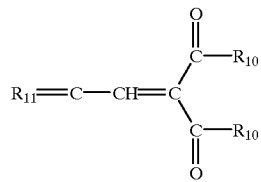

IV in which $R_{10}$ is as defined above, and $R_{11}$ is substituted or unsubstituted alkylidene having 1 to 4 carbon atoms, substituted or unsubstituted aralkylidene having 7 to 16 carbon atoms or a 5- or 6-membered heterocyclic ring. Particularly useful compounds of structure IV include, but are not limited to, cinnamylidenemalonic acid, 2-butenylidenemalonic acid, 3-pentenylidenemalonic acid, o-nitrocinnamylidenemalonic acid, naphthylallylidenemalonic acid, 2-furfurylideneethylidenemalonic acid, N-methylpyridinylidene-2-ethylidenemalonic acid, N-methylquinolidene-2-ethylidenemalonic acid, N-methylbenzothiazolylidene-2-ethylidenemalonic acid, and functional equivalents thereof. These and other useful compounds are described in U.S. Pat. No. 3,674,745 (Philipot et al.), the disclosure of which is incorporated herein by reference.

Structure V:

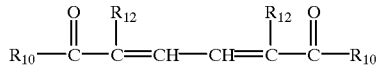

V in which $R_{10}$ is as defined above, and $R_{12}$ is hydrogen or methyl. Particularly useful compounds of structure V are trans, trans-muconic acid, cis, transmuconic acid, cis, cis-muconic acid, α,α'-cis, transdimethylmuconic acid, α,α'-cis, cis-dimethylmuconic acid and functional equivalents thereof. These and other useful compounds are described in U.S. Pat. No. 3,615,434 (McConkey), the disclosure of which is incorporated herein by reference.

Structure VI:

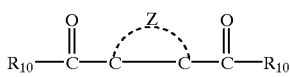

VI in which $R_{10}$ is as defined above, and Z represents the atoms necessary to form an unsaturated bridged or unbridged, substituted or unsubstituted carbocyclic nucleus of 6 or 7 carbon atoms. Particularly useful compounds of structure VI include, but are not limited to, 4-cyclohexene-1,2-dicarboxylic acid, 5-norbornene-2,3-dicarboxylic acid, hexachloro-5[2:2:1]-bicycloheptene-2,3-dicarboxylic acid and functional equivalents thereof. These and other useful compounds are described in Canadian Patent 824,096 (Mench et al.), the disclosure of which is incorporated herein by reference.

Structure VII:

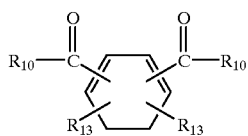

VII in which $R_{10}$ is as defined above, and $R_{13}$ is hydrogen, substituted or unsubstituted alkyl having 1 to 12 carbon atoms, substituted or unsubstituted cycloalkyl having 5 to 12 carbon atoms or substituted or unsubstituted aryl having 6 to 14 carbon atoms. $R_{10}$ can be substituted with any group that does not interfere with the condensation reaction, such as halo, nitro, aryl, alkoxy, aryloxy and others readily apparent to those skilled in the art. Particularly useful compounds include, but are not limited to, 1,3-cyclohexadiene-1,4-dicarboxylic acid, 1,3-cyclohexadiene-1,3-dicarboxylic acid, 1,5-cyclohexadiene-1,4-dicarboxylic acid, arylated and alkylated derivatives thereof, and functional equivalents thereof. These and other useful compounds are described, for example, in U.S. Pat. No. 3,776,737, the disclosure of which is incorporated herein by reference.

Particularly preferred photosensitive polyesters are prepared from p-phenylene diacrylates.

Besides the photosensitive dicarboxylic acids and equivalents noted in Structures III–VII above, the polyesters can also include repeating units derived from a second type of dicarboxylic acid (or functional equivalent) that promote solubilization of the unexposed polyester in alkaline developer solutions. Such dicarboxylic acids are generally non-photosensitive and can include disulfonamido units containing monovalent cations as amido nitrogen atom substituents as described, for example in U.S. Pat. No. 3,929,489 (Arcesi et al.) and U.S. Pat. No. 4,419,437 (Noonan et al.), both incorporated herein by reference.

Still further, another non-photosensitive dicarboxylic acid (or functional equivalent) can be used to prepare the polyester having no solubilizing groups. Various useful diacids are well known in the art and include, for example, phthalic acids (such as phthalic acid, isophthalic acid and terephthalic acid) and aliphatic dicarboxylic acids (such as malonic acid, glutaric acid, adipic acid, pimelic acid, suberic acid and other high homolog diacids).

Of the diacids used in preparing the polyesters described herein, the photosensitive diacids comprise at least 30 mole %, and preferably from about 50 to 100 mole %, based on total acids present in the reaction mixture.

Photosensitive Composition and Element

The diacids are condensed with one or more diols, or its functional equivalent, such a diester derived from the diol, to form the photosensitive polyesters. As is well known, the formation of the polyester by condensation inherently determines that the desired repeating units, such as the photosensitive repeating units, will be present. The diol, or its functional equivalent, produces the dye moiety on condensation.

Conventional condensation stoichiometry, reaction conditions and catalysts can be used. Generally, the reactants are mixed in the presence of a suitable catalyst, such as butyl titanate, titanium isopropoxide, antimony oxide, strontium oxide, zinc acetate and others known in the art. The degree and duration of heating can be used to increase the degree of polymerization. Typically, it is desired that the polyesters have an inherent viscosity of from about 0.1 to about 0.5, as measured at 25° C. in methylene chloride using 0.25 g of polyester per deciliter of solution.

The polymer should comprise sufficient dye to provide a visible image for effective inspection of a processed plate when the polymer is incorporated into a photosensitive composition. As will be apparent to those skilled in the art, the dye-containing polymer can be mixed with undyed polymer in the photosensitive composition, provided sufficient dye-containing polymer is present to provide a visible image after the plate has been processed.

A particularly preferred photosensitive polyester is a condensation product of diethyl p-phenylenediacrylate, 1,4-bis(2-hydroxyethoxy)cyclohexane and a compound of Formula I or II, such as the dye of Formula II in which $R_6$ is hydrogen and $R_7$ is —$CH_2$—$C(CH_3)_2$—$CH_2$—.

The photosensitive composition can be prepared by formulating a dyed photosensitive polyester with one or more components that are conventional to negative-working photosensitive compositions.

Coating compositions containing the photosensitive polyesters described above can be prepared by dissolving or dispersing one or more of the polyesters in one or more suitable solvents used in the art to prepare polymer "dopes". The solvents are chosen to be substantially unreactive with the polyesters or other components of the compositions within the time period needed for formulation, coating and drying, and are chosen to be compatible with the support employed for the photosensitive element. A number of solvents are known for this purpose as described for example in U.S. Pat. No. 3,929,489. Particularly useful solvents include, but are not limited to, 1-methoxy-2-propanol (and the acetate thereof), methyl pyrrolidone, methyl lactate, ethyl acetate, dimethylformamide, butyl acetate, tetrahydrofuran, butyrolactone, methyl ethyl ketone, acetone, toluene, or mixtures of two or more of these.

Optimal concentration of the photosensitive polyester in the coating composition is dependent upon the specific polyester recurring units, the support, and the coating method. Generally, the amount of polyester is from about 1 to about 12% of the wet coating composition weight, which would generally correspond to from about 10 to about 90% of the dry coating weight.

The negative-working photosensitive composition of this invention can also include one or more addenda that are commonly incorporated for various performance, coating and other purposes, including but not limited to surfactants, actinic radiation stabilizers, film-forming resin binder materials, anti-scumming agents and other materials known in the art, as described for example in U.S. Pat. Nos. 3,929,489, 4,139,390 (Rauner et al.), U.S. Pat. No. 5,043, 250 (West et al.), and U.S. Pat. No. 5,169,897 (Walls), all incorporated herein by reference.

Sensitizers are particularly useful to provide sensitivity to ultraviolet light. Various sensitizers are known for this purpose, but preferred ones are ketocoumarins, as described for example, in U.S. Pat. No. 4,416,973 (Goff) and U.S. Pat. No. 4,505,793 (Tamoto et al.). A particularly useful sensitizer is 3,3'-carbonyl bis(5,7-di-n-propoxy)coumarin. Another useful sensitizer of a different class is 2-bis(furanylcarbonyl)methylene-1-methyl naphthol(1,2-d)thiazoline.

The photosensitive composition also advantageously includes a "print-out" system such that upon exposure a differentiation is created between image and non-image areas. One useful compound for this purpose is 4-phenylazodiphenylamine, which is used in conjunction with a photoacid generator. Another print-out system includes leuco propyl violet in combination with a compound such as 4,4-(4-chlorophenyl)sulfonyl oxo-1,3-dioxobenz(d,e)-isoquinoline.

It is also preferred that the photosensitive composition of this invention include one or more adhesion promoters so that it has desired adhesion to the support of the element. Various adhesion promoters are known in the art, including but not limited to, monoalkoxysilanes, titanates and zirconates.

It is particularly useful to include adhesion promoters when a sulfuric acid treated aluminum printing plate support is used in the element. Useful adhesion promoters include diazo resins as described, for example, in U.S. Pat. No. 5,169,897 (Walls), and references cited therein, all incorporated herein by reference. Particularly useful diazo resins include condensation products of p-diazo diphenyl amine with paraformaldehyde, diazo(2,5-diethoxytolylmercapto)-benzene with paraformaldehyde, and 3-methoxy-4-diazo diphenylamine with paraformaldehyde. The diazo resins are present in the photosensitive composition in conventional amounts, i.e., at least about 0.5%, and preferably from about 20 to bout 50%, based on total dry coating weight.

Alternatively, a diazo resin coating can be applied to the element support prior to application of the photosensitive composition described above. In such compositions, the diazo resin may include at least 0.01%, and preferably from about 0.1 to about 12%, based on total dry coating weight. Such a layer can be coated out of suitable solvents, such as butyrolactone, 1-methoxy-2-propanol or mixtures thereof.

Suitable conditions for drying the photosensitive composition involve heating for a period of time of from about 0.5 to about 5 minutes at a temperature in the range of from about 20 to about 150° C.

To form a negative-working photosensitive element, the photosensitive composition is applied (usually by coating techniques) onto a suitable support, such as a metal, polymeric film, fabric, ceramic or polymericcoated paper using conventional procedures and equipment. Suitable metals include aluminum, zinc, silver, gold, copper, platinum or steel, but preferably, the metal is aluminum. A most preferred support is an electrochemically grained and sulfuric acid anodized aluminum sheet, as described for example, in U.S. Pat. No. 4,647,346 (Miller et al.) and U.S. Pat. No. 4,865,951 (Huddleston et al.), that has been further treated with an acrylamide-vinylphosphonic acid copolymer according to the teaching in U.S. Pat. No. 5,368,974 (Walls et al.). Such elements are generally known as lithographic printing plates, but other useful elements include printed circuit boards or other electrical devices.

The thickness of the resulting photosensitive imaging layer, after drying, on the support can vary widely, but typically it is in the range of from about 0.5 to about 2 $\mu$m, and preferably from about 1 to about 1.5 $\mu$m.

No other essential layers are provided on the element. In particular, a protective or other layer need not be disposed over the photosensitive imaging layer, but is optional. Optional subbing or anti-halation layers can be disposed under the imaging layer, or on the backside of the support, such as when the support is a transparent polymeric film. Known subbing layers can be used if desired, formed from copolymers of vinylidene chloride, acrylic monomers (such as acrylonitrile, methyl acrylate or methyl methacrylate), and unsaturated dicarboxylic acids (such as itaconic acid and benzoic acid), carboxymethyl cellulose, gelatin and polyacrylamide.

The element of this invention can be used to provide a negative image that can be used, for example in the printing industry. The element is typically exposed to a suitable imagewise pattern of actinic radiation (preferably rich in ultraviolet light) using conventional procedures and conditions, as described for example in U.S. Pat. No. 5,141, 842 (Mitchell et al.), U.S. Pat. No. 4,139,390 and U.S. Pat. No. 5,043,250 through a transparency or a stencil, to suitably crosslink and insolubilize the photosensitive polymer in the exposed areas. Many suitable light sources are known.

The exposed element can be developed by flushing, soaking, swabbing or otherwise treating it with a suitable alkaline developer solution until the non-image areas are removed to provide the desired negative image. Development can be carried out under conventional conditions for from about 30 to about 120 seconds. Some conventional developer solutions are alkaline mixtures of water and water-miscible alcohols, optionally containing one or more surfactants, dyes, pigments or anti-scumming agents. One useful aqueous alkaline developer solution is a silicate solution containing an alkali metal silicate or metasilicate. A number of such developer solutions are available from several commercial sources including Eastman Kodak Company.

After development, the element can be optionally treated in any known manner consistent with its end use, including contact with desensitizing etches or finishers containing gum arabic or a hydrolyzed starch. and do not limit it in any manner.

The advantageous properties of this invention can be observed by reference to the following examples which illustrate, but do not limit, the invention. Unless otherwise noted, all percentages are by weight.

Methods and Materials for Examples

A photosensitive polyester was prepared using conventional procedures described, for example, in U.S. Pat. No. 4,139,390.

A first "dyed" photosensitive polyester was similarly prepared by including in the reaction mixture CAS# 163597-26-0, benzenesulfonamide, 3,3' (or 4,4')-[9,10-dihydro-9,10-dioxo-1,4-anthracenediyl)diimino]bis-[ar-ethyl-N-hydroxyethyl)ar-methyl, a copolymerizable diol of Formula I above. The reaction mixture contained 9 moles of the diol, 41 moles of diethyl p-phenylenediacrylate, and 50 moles of 1,4-bis(2-hydroxyethoxy)-cyclohexane.

EXAMPLE 1

Preparation of Photosensitive Composition

Two photosensitive coating formulations ("Example 1" and "Control A") were prepared with the following components (in parts per weight of wet composition):

| Component | Example 1 | Control A |
|---|---|---|
| Photosensitive polyester | 0 | 3.00 |
| First "Dyed" Photosensitive polyester | 3.75 | 0 |
| Butyrolactone | 19.00 | 19.00 |
| Methyl ethyl ketone | 28.00 | 28.00 |
| Toluene | 48.58 | 47.73 |
| Surfactant | 0.07 | 0.07 |
| Coumarin sensitizer | 0.28 | 0.28 |
| Polyester oligomer* | 0.29 | 0.29 |
| 4-Phenylazodiphenylamine | 0.03 | 0.03 |
| Pigment dispersion (20% pigment) | 0 | 1.60 |

*Condensation product of phthalic acid diethyl ester and 1,4-(2-hydroxyethyl)cyclohexane.

EXAMPLE 2

Preparation of Photosensitive Element

Printing plate supports were prepared by electrochemical graining (hydrochloric acid) and anodizing (sulfuric acid) sheets of aluminum substrate. These sheets had also been treated with an acrylamidevinyl phosphonic acid copolymer as described in U.S. Pat. No. 5,368,974 (Walls et al.).

On these sheets was coated a formulation of a condensation product (0.20%) of diazo(2,5-diethoxytolylmercapto) benzene and paraformaldehyde that was isolated as the tetrafluoroborate, citric acid (0.01%), butyrolactone (15%) and 1-methoxy-2-propanol (84.79%) to provide a dry coating coverage of 40 mg/m².

On the diazo resin layer was applied either of the compositions described in Example 1.

The resulting Invention and Control printing plates were imagewise exposed and developed using Production Series Negative Developer, MX-1587/1.

The plates were then evaluated by comparing the density, resolution and press performance. During processing of the plates, it was observed that the Control printing plate discolored the developer solution and the developing pad because of pigment leaching out of the printing plate imaging layer. The printing plate of this invention, however, was processed more cleanly with no discoloration of either the developer solution or developing pad.

The density of both printing plates was the same when measured with an X-Rite densitometer. The $D_{max}$, or image density, was 0.89. The resolution was measured by using an UGRA test target. Two samples of both printing plates were processed and measured to evaluate resolution, the microlines ($\mu$ lines) and half tone dots. The resulting data are shown in the following table.

| MEASURED FEATURE | CONTROL A | EXAMPLE 1 |
|---|---|---|
| Plate $\mu$ lines | 4/6 | 4/6 |
| Plate half tone | 1–97 | 1–97 |
| Printed $\mu$ lines | 4/8 | 4/8 |
| Printed half tone | 1–95 | 1–95 |

"Microlines" ($\mu$ lines) are circular targets comprised of lines and spaces of equal dimension, that is 4 microlines and 4 microspaces. There are a series of circles increasing in line width and spacing, that is, 4, 6, 8, 10, etc. The first number designation is for the positive portion of the target, and the second number designates the negative portion of the image. Smaller numbers are desired since they indicate better resolution.

"Half tones" or dots are measured as percentages of any unit area that comprises the image. The first number begins with 0.5 and can be 1, 2, 3, 4, 5, 10, 20, etc. The second number can be 90, 95, 96, 97, 98, 99 and 99.5. The better the resolution, the lower the first number and the higher the second number.

As can be seen by the data in the Table, the plate resolution and printed images were excellent for both the Control and Invention plates. This was unexpected because it was believed that the presence of the first "dyed" photosensitive polymer might reduce the plate properties. The press performance in terms of roll up, background cleanliness and quality of print were considered to be equal for both printing plates. The present invention provided superior cleanliness in development with no loss of plate performance.

EXAMPLE 3

Alternative Compositions and Single-Layer Elements

The following Example 3 and Control B compositions were prepared and coated as single layers on aluminum sheets as described in Example 2.

| Component | Example 3 | Control B |
|---|---|---|
| Photosensitive polyester | 0 | 3.00 |
| First "dyed" photosensitive polyester | 3.75 | 0 |
| Butyrolactone | 19.00 | 19.00 |
| 1-Methoxy-2-propanol | 28.00 | 28.00 |
| Toluene | 48.04 | 47.19 |
| Surfactant | 0.07 | 0.07 |
| Coumarin sensitizer | 0.28 | 0.28 |
| Polyester oligomer* | 0.29 | 0.29 |
| 4-Phenylazodiphenylamine | 0.03 | 0.03 |
| Pigment dispersion (20% pigment) | 0 | 1.60 |
| Bisphenol A-fumarate copolymer | 0.34 | 0.34 |
| Diazo resin** | 0.20 | 0.20 |

*Condensation product of phthalic acid diethyl ester and 1,4-(2-hydroxyethyl)cyclohexane.
**As described in Example 2.

The printing plates described above were evaluated as described in Example 2, with the same excellent results in development cleanliness and plate performance for the printing plate of this invention.

EXAMPLE 4

Preparation and Evaluation of a Second Photosensitive Composition

A second "dyed" photosensitive polyester was similarly prepared by including in the reaction mixture 1,4-bis-[(3-hydroxy-2,2-dimethylpropyl)amino]anthraquinone, a copolymerizable diol of Formula II in which $R_6$ is hydrogen and $R_7$ is —$CH_2$—$C(CH_3)_2$—$CH_2$—. Preparation of this diol is disclosed in Example 3 of U.S. Pat. No. 5,032,670 (Parham et al.), incorporated herein by reference. GPC showed a $M_w$ of 25,600 and a $M_w/M_n$ of 3.47. Evaluation of the second "dyed" photosensitive polyester by a procedure similar to that described above gives similar results.

Having described the invention, we now claim the following and their equivalents.

What is claimed is:

1. A negative-working photosensitive composition comprising a photosensitive polyester that comprises:
    (a) an unsaturated photosensitive moiety comprising photopolymerizable —CH=CH—CO— groups, and
    (b) a dye moiety represented by Formula I or II:

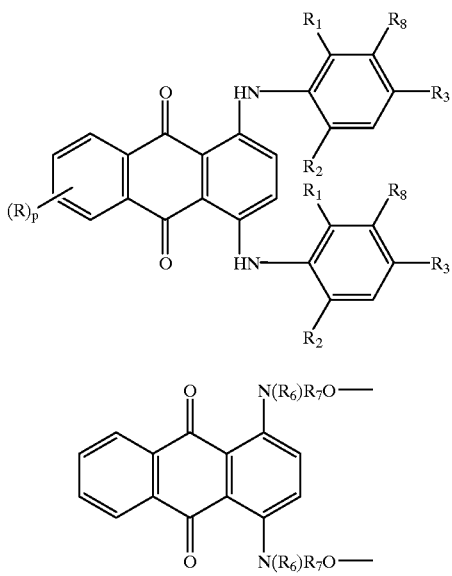

in which R is lower alkyl, halo, hydroxy, carboxy or carbonylalkoxy; $R_1$ and $R_2$ are independently lower alkyl, lower alkoxy or halo; $R_3$ is hydrogen, lower alkyl, lower alkoxy, halo, or —$SO_2N(R_4)R_5O$— in which the sulfur is attached to a carbon of an aromatic ring of the dye moiety; $R_4$ is hydrogen, methyl, ethyl or phenyl; $R_5$ and $R_7$ are independently alkylene having 2 to 7 carbon atoms or phenylene; $R_6$ is hydrogen, methyl, ethyl or phenyl; $R_8$ is hydrogen or —$SO_2N(R_4)R_5O$— in which the sulfur is attached to a carbon of the aromatic ring of the dye moiety, with the proviso that either $R_3$ or $R_8$, but not both $R_3$ and $R_8$, is —$SO_2N(R_4)R_5O$—; and p is 0, 1 or 2.

2. The composition of claim 1 in which the dye moiety is represented by Formula I; R is methyl, ethyl, carboxy or methoxycarbonyl; $R_1$ and $R_2$ are independently methyl or ethyl; $R_3$ is hydrogen or ethyl; $R_4$ is hydrogen or ethyl; $R_5$ is ethylene, 2,2-dimethylpropylene or 2,2-dimethylpentylene; and $R_8$ is —$SO_2N(R_4)R_5O$—.

3. The composition of claim 2 in which R is methyl or ethyl; $R_1$ and $R_2$ are each methyl or ethyl; and $R_5$ is ethylene, 2,2-dimethylpropylene or 2,2-dimethylpentylene.

4. The composition of claim 1 in which the dye moiety is represented by Formula I; R is methyl, ethyl, carboxy or methoxycarbonyl; $R_1$ and $R_2$ are independently methyl or ethyl; $R_3$ is —$SO_2N(R_4)R_5O$—; $R_4$ is hydrogen or ethyl; $R_5$ is ethylene, 2,2-dimethylpropylene or 2,2-dimethylpentylene; and $R_8$ is hydrogen.

5. The composition of claim 1 in which the dye moiety is represented by Formula II; and $R_6$ is hydrogen; and $R_7$ is alkylene having 2 to 7 carbon atoms or phenylene.

6. The composition of claim 1 in which the photosensitive polyester comprises a pendent —$CH_2CH_2OC(O)C(CH_3)$=$CH_2$, —$CH_2CH(OH)CH_2OC(O)C(CH_3)$=$CH_2$, —$CH_2CH_2OC(O)CH$=$CH_2$, or —$CH_2CH(OH)CH_2OC(O)CH$=$CH_2$.

7. The composition of claim 1 in which the photosensitive polyester is a condensation product of diethyl p-phenylenediacrylate, 1,4-(2-hydroxyethoxy) cyclohexane, and a copolymerizable diol that provides the dye moiety.

8. The composition of claim 1 further comprising a free radical sensitizer.

9. The composition of claim 1 further comprising a diazo resin.

10. The composition of claim 1 in which the photosensitive polyester is present at from about 1 to about 12% by weight.

11. A negative-working photosensitive element comprising a support and a photosensitive layer comprising the negative-working photosensitive composition of claim 1.

12. The element of claim 11 in which the support is an electrochemically grained and sulfuric acid anodized aluminum sheet that has been further treated with an acrylamide-vinylphosphonic acid.

13. The element of claim 11 in which the dye moiety is represented by Formula I; R is methyl, ethyl, carboxy or methoxycarbonyl; $R_1$ and $R_2$ are independently methyl or ethyl; $R_3$ is hydrogen or ethyl; $R_4$ is hydrogen or ethyl; $R_5$ is ethylene, 2,2-dimethylpropylene or 2,2-dimethylpentylene; and $R_8$ is —$SO_2N(R_4)R_5O$—.

14. The element of claim 13 in which R is methyl or ethyl; $R_1$ and $R_2$ are each methyl or ethyl; and $R_5$ is ethylene, 2,2-dimethylpropylene or 2,2-dimethylpentylene.

15. The element of claim 11 in which the dye moiety is represented by Formula I; R is methyl, ethyl, carboxy or methoxycarbonyl; $R_1$ and $R_2$ are independently methyl or ethyl; $R_3$ is —$SO_2N(R_4)R_5O$—; $R_4$ is hydrogen or ethyl; $R_5$ is ethylene, 2,2-dimethylpropylene or 2,2-dimethylpentylene; and $R_8$ is hydrogen.

16. The element of claim 11 in which the dye moiety is represented by Formula II; and $R_6$ is hydrogen; and $R_7$ is alkylene having 2 to 7 carbon atoms or phenylene.

17. The element of claim 11 in which the photosensitive polyester comprises a pendent —$CH_2CH_2OC(O)C(CH_3)$=$CH_2$, —$CH_2CH(OH)CH_2OC(O)C(CH_3)$=$CH_2$, —$CH_2CH_2OC(O)CH$=$CH_2$, or —$CH_2CH(OH)CH_2OC(O)CH$=$CH_2$.

18. The element of claim 11 in which the photosensitive polyester is a condensation product of diethyl p-phenylenediacrylate, 1,4-(2-hydroxyethoxy)cyclohexane, and a copolymerizable diol that provides the dye moiety.

19. The element of claim 11 in which the negative-working photosensitive composition further comprises a free radical sensitizer.

20. The element of claim 11 in which the negative-working photosensitive composition further comprises a diazo resin.

21. The element of claim 11 in which the photosensitive polyester is present in the negative-working photosensitive composition at from about 1 to about 12% by weight.

* * * * *